United States Patent
Kim et al.

(10) Patent No.: US 11,527,900 B2
(45) Date of Patent: Dec. 13, 2022

(54) APPARATUS AND METHOD FOR MANAGING A BATTERY BASED ON DEGRADATION DETERMINATION

(71) Applicant: HYUNDAI MOBIS CO., LTD., Seoul (KR)

(72) Inventors: Dong Rak Kim, Hwaseong-si (KR); Jae Rok Kim, Hwaseong-si (KR); Chang Gi Jung, Incheon (KR); Seoung Mun Back, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 146 days.

(21) Appl. No.: 16/850,813

(22) Filed: Apr. 16, 2020

(65) Prior Publication Data
US 2020/0335979 A1 Oct. 22, 2020

(30) Foreign Application Priority Data
Apr. 18, 2019 (KR) .......................... 10-2019-0045568

(51) Int. Cl.
*H02J 7/00* (2006.01)
*G01R 31/367* (2019.01)
(Continued)

(52) U.S. Cl.
CPC .............. *H02J 7/005* (2020.01); *B60L 58/13* (2019.02); *B60L 58/16* (2019.02); *G01R 31/367* (2019.01);
(Continued)

(58) Field of Classification Search
CPC ...... H02J 7/005; H02J 7/0049; H02J 7/00712; G01R 31/367; G01R 31/392; B60L 58/13; B60L 58/16
(Continued)

(56) References Cited

U.S. PATENT DOCUMENTS 6,285,162 B1* 9/2001 Koo ...................... H02J 7/0021
320/132
6,563,318 B2* 5/2003 Kawakami ........... G01R 31/389
324/426
(Continued)

FOREIGN PATENT DOCUMENTS

CN 103163480 A * 6/2013
JP 2009071986 A * 4/2009
(Continued)

*Primary Examiner* — John T Trischler
(74) *Attorney, Agent, or Firm* — Morgan, Lewis & Bockius LLP (57) ABSTRACT

An apparatus and a method for managing a battery are based upon degradation determination of the battery. The method includes determining a charging method when starting charging of a battery, storing at least one of a charge voltage, charge current, and temperature when starting charging of the battery, and when the determined charging method is constant current (CC) charging, determining a state of health (SOH) of the battery by comparing an increase in charge capacity of the battery with respect to an increase in charge voltage of the battery with a CC-section SOH mapping table, or when the determined charging method is constant voltage (CV) charging, determining the SOH of the battery by comparing at least one of an increase in the charge capacity of the battery and a charge time of the battery with a CV-section SOH mapping table.

18 Claims, 10 Drawing Sheets

(51) Int. Cl.
 *G01R 31/392* (2019.01)
 *B60L 58/16* (2019.01)
 *B60L 58/13* (2019.01)
 *B60L 58/12* (2019.01)

(52) U.S. Cl.
 CPC .......... *G01R 31/392* (2019.01); *H02J 7/0049* (2020.01); *H02J 7/00712* (2020.01); *B60L 58/12* (2019.02); *H02J 7/007188* (2020.01); *Y02T 10/7072* (2013.01)

(58) Field of Classification Search
 USPC ....................................................... 320/134
 See application file for complete search history.

(56) References Cited

U.S. PATENT DOCUMENTS

| | | | | |
|---|---|---|---|---|
| 6,583,606 | B2* | 6/2003 | Koike | H02J 7/0069 320/149 |
| 6,586,940 | B2* | 7/2003 | Asakura | G01R 31/392 324/426 |
| 6,747,457 | B2* | 6/2004 | Suzuki | B60L 7/14 324/433 |
| 6,956,355 | B2* | 10/2005 | Vaillancourt | H02J 7/0047 320/132 |
| 7,317,299 | B2* | 1/2008 | Koo | G01R 31/392 320/132 |
| 7,429,849 | B2* | 9/2008 | Shoji | G01R 31/3842 320/150 |
| 7,974,797 | B2* | 7/2011 | Shoji | G01R 31/396 702/63 |
| 8,258,751 | B2* | 9/2012 | Esnard | H01M 10/44 320/132 |
| 8,299,759 | B2* | 10/2012 | Okamura | H02J 7/0072 320/134 |
| 8,380,452 | B2* | 2/2013 | Maegawa | G01R 31/396 702/182 |
| 8,587,254 | B2* | 11/2013 | Kobayashi | H02J 7/0069 320/130 |
| 9,178,380 | B2* | 11/2015 | Kawai | H02J 7/045 |
| 9,196,934 | B2* | 11/2015 | Moon | H01M 10/613 |
| 9,229,064 | B2* | 1/2016 | Chou | G01R 31/392 |
| 9,612,291 | B2* | 4/2017 | Sung | H01M 10/48 |
| 9,714,984 | B2* | 7/2017 | Kim | G01R 31/392 |
| 9,793,735 | B2* | 10/2017 | Choi | H02J 7/022 |
| 9,847,663 | B2* | 12/2017 | Nishikawa | H02J 7/007 |
| 9,935,325 | B2* | 4/2018 | Son | H01M 8/0438 |
| 10,017,069 | B2* | 7/2018 | Lim | H02J 7/007182 |
| 10,036,781 | B2* | 7/2018 | Vinassa | H02J 7/005 |
| 10,060,986 | B2* | 8/2018 | Imaizumi | G01R 31/3842 |
| 10,205,329 | B2* | 2/2019 | Zhou | H02J 7/0047 |
| 10,330,738 | B2* | 6/2019 | Kim | G01R 31/367 |
| 10,365,331 | B2* | 7/2019 | Bryngelsson | G01R 31/392 |
| 10,393,819 | B2* | 8/2019 | You | G01R 31/392 |
| 10,534,028 | B2* | 1/2020 | Stewart | H01M 10/482 |
| 10,557,893 | B2* | 2/2020 | Fukushima | H02J 7/005 |
| 10,576,841 | B2* | 3/2020 | Yoo | B60L 58/12 |
| 10,677,853 | B2* | 6/2020 | Laughery | H01M 10/44 |
| 10,868,342 | B2* | 12/2020 | Tanaka | H02J 7/00306 |
| 10,971,766 | B2* | 4/2021 | Nakamoto | G01R 31/378 |
| 11,002,793 | B2* | 5/2021 | Lim | H01M 10/482 |
| 11,073,567 | B2* | 7/2021 | Ryu | B60L 58/12 |
| 11,108,261 | B2* | 8/2021 | Youn | B60L 58/13 |
| 2001/0022518 | A1* | 9/2001 | Asakura | H02M 3/07 324/426 |
| 2002/0014879 | A1* | 2/2002 | Koike | H02J 7/0069 320/133 |
| 2002/0109506 | A1* | 8/2002 | Kawakami | G01R 31/392 324/522 |
| 2003/0030414 | A1* | 2/2003 | Suzuki | H01M 10/44 320/136 |
| 2003/0071599 | A1* | 4/2003 | Yoo | G01R 31/36 320/132 |
| 2004/0232884 | A1* | 11/2004 | Vaillancourt | G01R 31/392 320/132 |
| 2005/0035743 | A1* | 2/2005 | Kawakami | H01M 10/48 320/162 |
| 2005/0110466 | A1* | 5/2005 | Shoji | G01R 31/3842 320/150 |
| 2006/0152224 | A1* | 7/2006 | Kim | G01R 31/392 324/430 |
| 2007/0114972 | A1* | 5/2007 | Koo | G01R 31/392 320/132 |
| 2009/0024339 | A1* | 1/2009 | Shoji | G01R 31/3842 702/63 |
| 2009/0134843 | A1* | 5/2009 | Mizuno | G01R 31/3648 320/134 |
| 2010/0156351 | A1* | 6/2010 | Ugaji | H01M 10/44 320/132 |
| 2010/0188054 | A1* | 7/2010 | Asakura | H02J 7/00712 320/161 |
| 2010/0201323 | A1* | 8/2010 | Okamura | H02J 7/0031 320/134 |
| 2010/0250163 | A1* | 9/2010 | Maegawa | G01R 31/3842 702/63 |
| 2010/0285349 | A1* | 11/2010 | Goto | H01M 10/484 429/156 |
| 2011/0301891 | A1* | 12/2011 | Kim | B60L 3/0046 702/63 |
| 2012/0049804 | A1* | 3/2012 | Kobayashi | H01M 10/441 320/150 |
| 2012/0200266 | A1* | 8/2012 | Berkowitz | H02J 7/00711 320/139 |
| 2013/0166234 | A1* | 6/2013 | Chou | G01R 31/392 702/63 |
| 2014/0165538 | A1* | 6/2014 | Kim | F02D 41/0235 60/274 |
| 2014/0232411 | A1* | 8/2014 | Vaidya | G01R 31/392 324/426 |
| 2015/0115969 | A1* | 4/2015 | Ishida | G01R 31/3842 324/426 |
| 2015/0160304 | A1* | 6/2015 | Nam | G01R 31/3648 702/63 |
| 2015/0268309 | A1* | 9/2015 | Kim | G01R 31/392 324/432 |
| 2015/0377976 | A1* | 12/2015 | Maluf | H02J 7/0047 702/63 |
| 2016/0003917 | A1* | 1/2016 | You | G01R 31/367 702/63 |
| 2016/0041229 | A1* | 2/2016 | Park | G01R 31/389 702/63 |
| 2016/0109523 | A1* | 4/2016 | Kim | G01R 31/367 324/430 |
| 2016/0116546 | A1* | 4/2016 | Sung | H01M 10/48 324/430 |
| 2016/0178706 | A1* | 6/2016 | Liu | G01R 31/392 702/63 |
| 2016/0245876 | A1* | 8/2016 | Vinassa | B60L 58/16 |
| 2016/0252582 | A1* | 9/2016 | Iida | H01M 10/425 702/63 |
| 2016/0266209 | A1* | 9/2016 | Imaizumi | G01R 31/3842 |
| 2016/0266211 | A1* | 9/2016 | Imaizumi | G01R 31/392 |
| 2016/0299197 | A1* | 10/2016 | Kim | G01R 31/367 |
| 2016/0336623 | A1* | 11/2016 | Nayar | H01M 4/44 |
| 2016/0380293 | A1* | 12/2016 | Son | H01M 8/0438 429/446 |
| 2017/0038436 | A1* | 2/2017 | Montaru | G01R 31/392 |
| 2017/0067967 | A1* | 3/2017 | Bryngelsson | G01R 31/392 |
| 2017/0144563 | A1* | 5/2017 | Lim | H02J 7/0021 |
| 2017/0294689 | A1* | 10/2017 | Wada | H02J 7/0049 |
| 2017/0307693 | A1* | 10/2017 | Fukuda | G01B 21/32 |
| 2017/0371000 | A1* | 12/2017 | Fukushima | H02J 7/0069 |
| 2018/0086215 | A1* | 3/2018 | Yoo | B60L 58/12 |
| 2018/0145531 | A1* | 5/2018 | Jung | H02J 7/0021 |
| 2018/0219393 | A1* | 8/2018 | Zhou | H02J 7/00 |
| 2018/0299511 | A1* | 10/2018 | Kim | G01R 31/392 |
| 2018/0372806 | A1* | 12/2018 | Laughery | G01R 31/378 |
| 2019/0054837 | A1* | 2/2019 | Tanaka | H01M 10/44 |
| 2019/0195956 | A1* | 6/2019 | Lim | H01M 10/482 |
| 2020/0110136 | A1* | 4/2020 | Ryu | H02J 7/007 |

(56) References Cited

U.S. PATENT DOCUMENTS

| | | | |
|---|---|---|---|
| 2020/0185943 A1* | 6/2020 | Youn | B60L 58/16 |
| 2020/0217898 A1* | 7/2020 | Lee | B60L 3/12 |
| 2020/0241075 A1* | 7/2020 | Kondo | H01M 10/425 |
| 2021/0013530 A1* | 1/2021 | Dong | H01M 8/04641 |
| 2021/0034123 A1* | 2/2021 | Maeng | B60L 53/80 |
| 2021/0091582 A1* | 3/2021 | Jin | H02J 7/00712 |
| 2021/0103000 A1* | 4/2021 | Fujino | G01R 31/388 |
| 2021/0156925 A1* | 5/2021 | Park | H01M 10/0525 |
| 2021/0181261 A1* | 6/2021 | Oh | B60L 58/16 |
| 2021/0181262 A1* | 6/2021 | Park | G01R 31/3835 |

FOREIGN PATENT DOCUMENTS

| | | | | |
|---|---|---|---|---|
| JP | 2010186619 A | * | 8/2010 | H02J 7/0031 |
| JP | 6439565 B2 | | 12/2018 | |
| WO | WO-2015011773 A1 | * | 1/2015 | G01R 31/389 |
| WO | WO-2015198631 A1 | * | 12/2015 | H03M 7/30 |

\* cited by examiner

APPARATUS AND METHOD FOR MANAGING A BATTERY BASED ON DEGRADATION DETERMINATION

CROSS-REFERENCE TO RELATED APPLICATION

This application claims priority to and the benefit of Korean Patent Application No. 10-2019-0045568, filed on Apr. 18, 2019, the disclosure of which is incorporated herein by reference in its entirety.

BACKGROUND

1. Field of the Invention

The present invention relates to an apparatus and method for managing a vehicle battery, and more particularly, to an apparatus and method for detecting the degree of battery degradation and improving efficiency of management which includes battery charging and discharging control and battery diagnosis by using the detected degree of battery degradation.

2. Discussion of Related Art

Unlike internal-combustion vehicles, electric vehicles are generally pollution-free vehicles in which a drive motor is operated with electrical energy stored in a battery and wheels are rotated by the motor through a power transmission system. As severe environmental pollution becomes problematic for human beings together with the depletion of petroleum resources, development of a low-pollution electric vehicle is attracting attention.

Most electrical vehicles acquire power by operating an alternating current (AC) or direct current (DC) motor with the electric power of a battery. Electric vehicles are generally classified as battery electric vehicles and hybrid electric vehicles. In battery electric vehicles, a motor is operated with the electric power of a battery, and the battery is charged when the electric power is used up. In hybrid electric vehicles, a battery is charged using a method of generating electricity by operating engines, and an electric motor is operated with the electricity of the charged battery.

As such, performance of electric vehicles is directly affected by battery performance. Therefore, battery performance should be high, and it is necessary to efficiently manage charging and discharging of a battery by measuring a voltage, current, etc. of the battery. Here, a battery management system (BMS) which is a battery controller installed in a vehicle manages a battery charging and discharging characteristic at an appropriate level. However, as a battery lifespan is reduced, the battery may not be sufficiently charged.

Also, when a battery is left discharged for a long time due to a user's mistake, an active material in the battery is fixed, and thus the battery lifespan is reduced (battery degradation). When an algorithm for measuring a battery charge amount at the initial life stage of a battery is applied to a battery which has been degraded as described above, a significant error occurs in diagnosing a battery state.

SUMMARY OF THE INVENTION

The present invention is directed to providing an apparatus and method for determining the degree of battery degradation in order to improve accuracy in diagnosing a battery state.

The present invention is also directed to providing an apparatus and method for managing a battery using a battery degradation estimation method in order to improve accuracy in diagnosing a battery state.

According to an aspect of the present invention, there is provided a method of measuring a degree of battery degradation, the method including determining a charging method when starting charging of a battery, storing at least one of a voltage, a current, and a temperature when starting charging of the battery, and when the determined charging method is constant current (CC) charging, determining a state of health (SOH) of the battery by comparing an increase in charge capacity of the battery with respect to an increase in charge voltage of the battery with a CC-section SOH mapping table, or when the determined charging method is constant voltage (CV) charging, determining the SOH of the battery by comparing at least one of an increase in the charge capacity of the battery and a charge time of the battery with a CV-section SOH mapping table.

The determining of the charging method for starting charging of the battery may include comparing a full charge state of the battery with a charge state of the battery when starting charging of the battery, determining at least one of a CC charging section and a CV charging section on the basis of the comparing, and determining one of CC charging and CV charging on the basis of the determined charging section.

The full charge state of the battery may be determined by at least one of an effective maximum charge capacity and an effective maximum output voltage of the battery, and the charge state of the battery when starting charging of the battery may be determined by at least one of a battery capacity state and output voltage.

The CC-section SOH mapping table may be a set of information on battery capacities at specific voltages according to each SOH of the battery.

The determining of the SOH of the battery by comparing the increase in the charge capacity of the battery with respect to the increase in the charge voltage of the battery with the CC-section SOH mapping table may include determining the SOH of the battery by comparing information on at least one voltage-specific battery capacity selected from the CC-section SOH mapping table with the increase in the charge capacity of the battery with respect to the increase in the charge voltage of the battery.

The CV-section SOH mapping table may be a set of CV-section charge capacity information and CV-section charge time information according to each SOH of the battery.

The determining of the SOH of the battery by comparing the at least one of the increase in the charge capacity of the battery and the charge time of the battery with the CV-section SOH mapping table may include determining the SOH of the battery by comparing at least one of CV-section charge capacity increase information and charge time information selected from the CV-section SOH mapping table with at least one of the increase in the charge capacity of the battery and an increase in the charge time of the battery.

According to another aspect of the present invention, there is provided a method of managing a battery considering battery degradation, the method including starting charging of a battery, measuring a degree of degradation of the battery by using at least one of CC charging and CV charging selected on the basis of a state of the battery, and charging the battery by using a battery charging and discharging algorithm selected on the basis of the measured degree of degradation of the battery.

The method may further include diagnosing the state of the battery by using a battery diagnosis algorithm selected on the basis of the measured degree of degradation of the battery.

The method may further include, when CC charging is selected, determining an SOH of the battery by comparing an increase in charge capacity of the battery with respect to an increase in charge voltage of the battery with a CC-section SOH mapping table.

The CC-section SOH mapping table may be a set of information on battery capacities at specific voltages according to each SOH of the battery.

The determining of the SOH of the battery by comparing the increase in the charge capacity of the battery with respect to the increase in the charge voltage of the battery with the CC-section SOH mapping table may include determining the SOH of the battery by comparing information on at least one voltage-specific battery capacity selected from the CC-section SOH mapping table with the increase in the charge capacity of the battery with respect to the increase in the charge voltage of the battery.

The method may further include, when CV charging is selected, determining an SOH of the battery by comparing at least one of an increase in charge capacity of the battery and a charge time of the battery with a CV-section SOH mapping table.

The CV-section SOH mapping table may be a set of CV-section charge capacity information and CV-section charge time information according to each SOH of the battery.

The determining of the SOH of the battery by comparing at least one of the increase in the charge capacity of the battery and the charge time of the battery with the CV-section SOH mapping table may include determining the SOH of the battery by comparing at least one of CV-section charge capacity increase information and charge time information selected from the CV-section SOH mapping table with at least one of the increase in the charge capacity of the battery and an increase in the charge time of the battery.

According to another aspect of the present invention, there is provided an apparatus for managing a battery considering battery degradation, the apparatus including a battery controller, a battery state storage, a charging method determiner, and a battery degradation determiner.

The charging method determiner may determine at least one of CC charging and CV charging on the basis of a result of comparing a full charge state of the battery with a state of the battery when starting charging of the battery.

The battery degradation determiner may include at least one of a CC-section SOH determiner and a CV-section SOH determiner.

The battery controller may perform at least one of battery charging and discharging control and battery diagnosis by considering battery degradation.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Since the present invention may be variously modified and have various embodiments, some embodiments will be illustrated in the drawings and described in detail. However, this is not intended to limit the present invention to specific embodiments, and it should be understood that the scope of the present invention covers all of the modifications, alterations, equivalents, and replacements within the technical spirit of the present invention derived from the embodiments.

Although the terms, such as first and second, are used to describe various elements, the elements should not be limited by the terms. The terms are used only to distinguish one element from other elements. For example, without departing from the scope of the present invention, a first element may be termed a second element, and similarly, a second element may be termed a first element. The term "and/or" includes any one or all combinations of a plurality of associated listed items.

It is to be understood that when an element is referred to as being "connected" or "coupled" to another element, the element may be directly connected or coupled to the other element or an intermediate element may be present. It is to be understood that there is no intermediate element only when an element is referred to as being "directly connected" or "directly coupled" to another element.

Terminology used in this specification is for the purpose of describing embodiments set forth herein and is not intended to limit the present invention. Unless the context clearly indicates otherwise, the singular forms include the plural forms as well. It is to be understood that the terms "include," "have," etc., when used herein, specify the presence of stated features, integers, steps, operations, elements, parts, and combinations thereof and do not preclude the presence or addition of one or more other features, integers, steps, operations, elements, parts, and combinations thereof.

All terms including technical and scientific terms used herein have the same meaning as commonly understood by those of ordinary skill in the art to which the present invention pertains and should not be interpreted in an idealized or overly formal sense. When any term is defined in this specification, the term should be interpreted accordingly.

Hereinafter, exemplary embodiments of the present invention will be described in detail with reference to the accompanying drawings. In describing the present invention, to aid in overall understanding of the present invention, the same elements may have the same reference numeral, and description of the same elements will not be reiterated.

Figure 1:
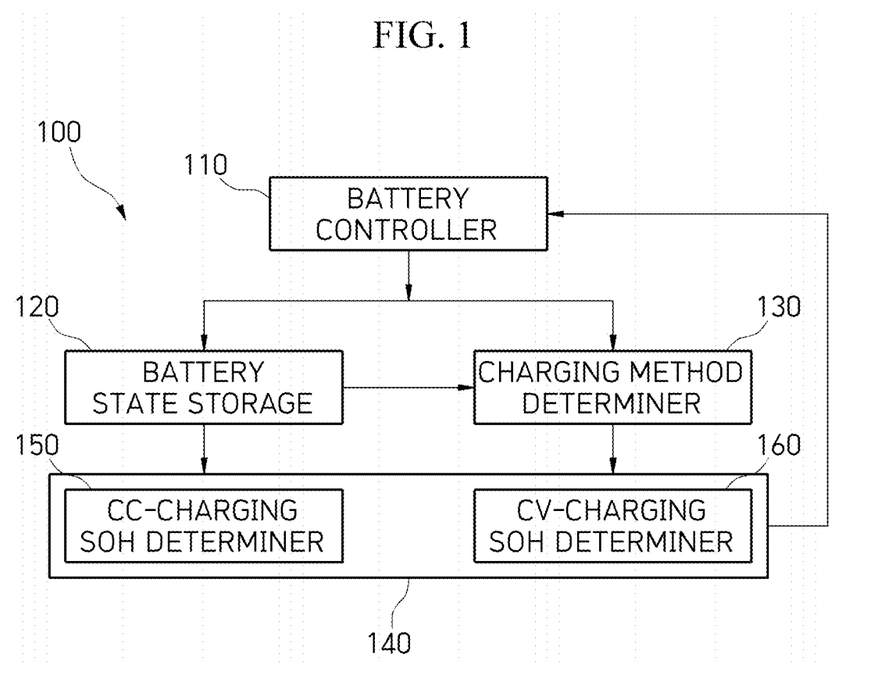
FIG. 1 is a block diagram illustrating an apparatus for managing a battery according to an exemplary embodiment of the present invention.

FIG. 1 is a block diagram illustrating an apparatus for managing a battery according to an exemplary embodiment of the present invention.

Referring to FIG. 1, an apparatus 100 for managing a battery according to the exemplary embodiment of the present invention includes a battery controller 110, a battery state storage 120, a charging method determiner 130, and a battery degradation determiner 140.

Figure 3:
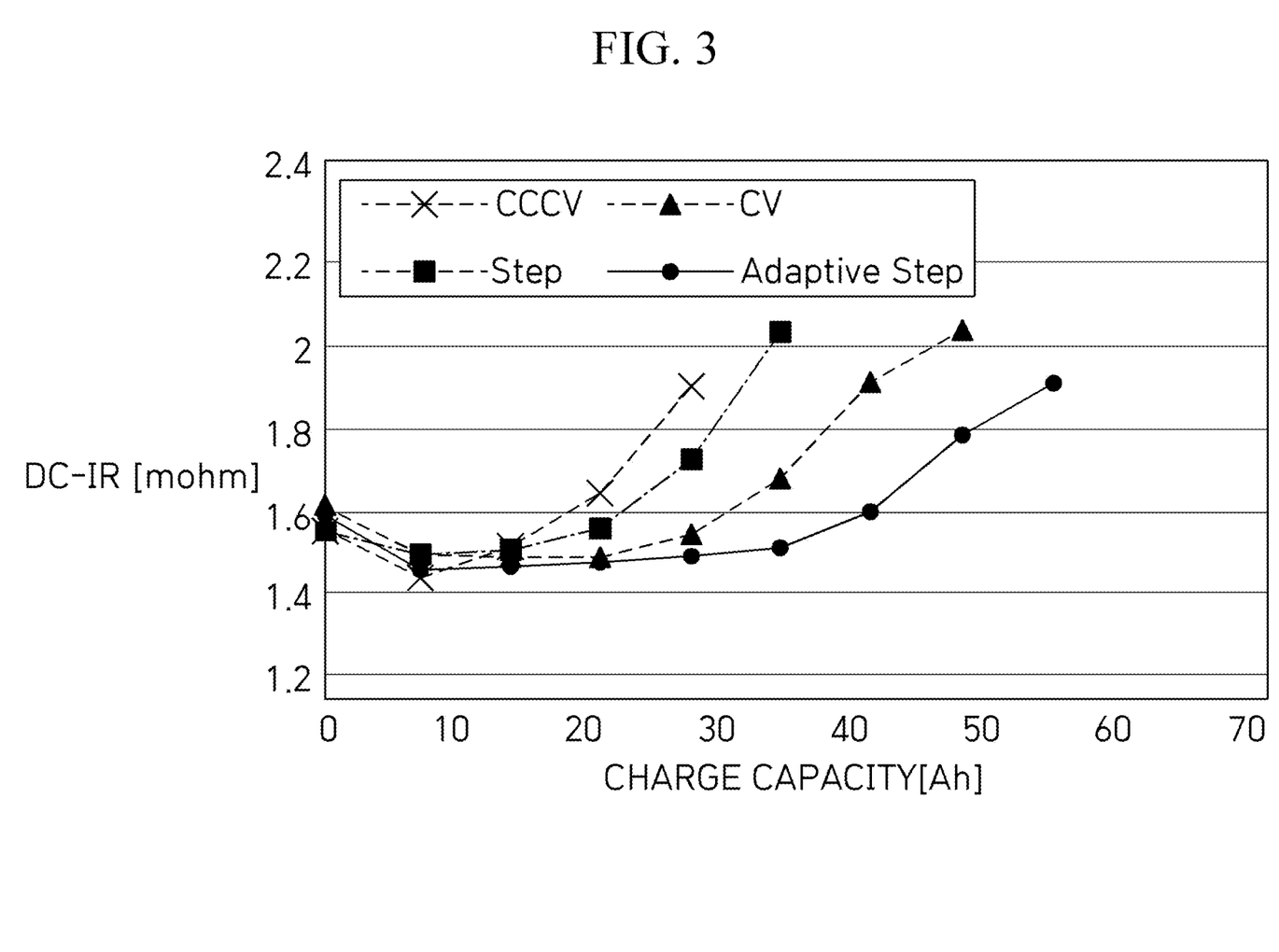
FIG. 3 is a conceptual diagram illustrating resistance degradation of a battery according to a related art.

As a battery installed in an electric vehicle is repeatedly charged and discharged, the performance is degraded, and the lifespan runs out. In general, the aging of a battery is detected by measuring a change in the internal resistance thereof. As shown in FIG. 3, when a battery is initially produced in a factory and shipped, the internal resistance is very small. As the battery is repeatedly charged and discharged, the internal resistance increases so high that the electric power may not be transmitted to an electronic device.

Therefore, to increase the lifespan of a battery, it is necessary to effectively manage charging and discharging. As the internal resistance of a battery is changed, the capacity of the battery is changed, and the state of health (SOH) may be estimated using the internal resistance and temperature of the battery.

Meanwhile, in the following exemplary embodiments, a state of charging (SOC) indicates a battery charge state. For example, when the battery is fully charged, the SOC may be 100%, and when the battery is fully discharged, the SOC may be 0%. Also, an SOH indicates the expected remaining lifespan of a battery or the full charge capacity or the degree of degradation of a degraded battery with respect to the full charge capacity upon initial production of the battery. For example, a new battery may have an SOH of 100%, and a battery whose lifespan has run out may have an SOH of 0%.

Figure 2:
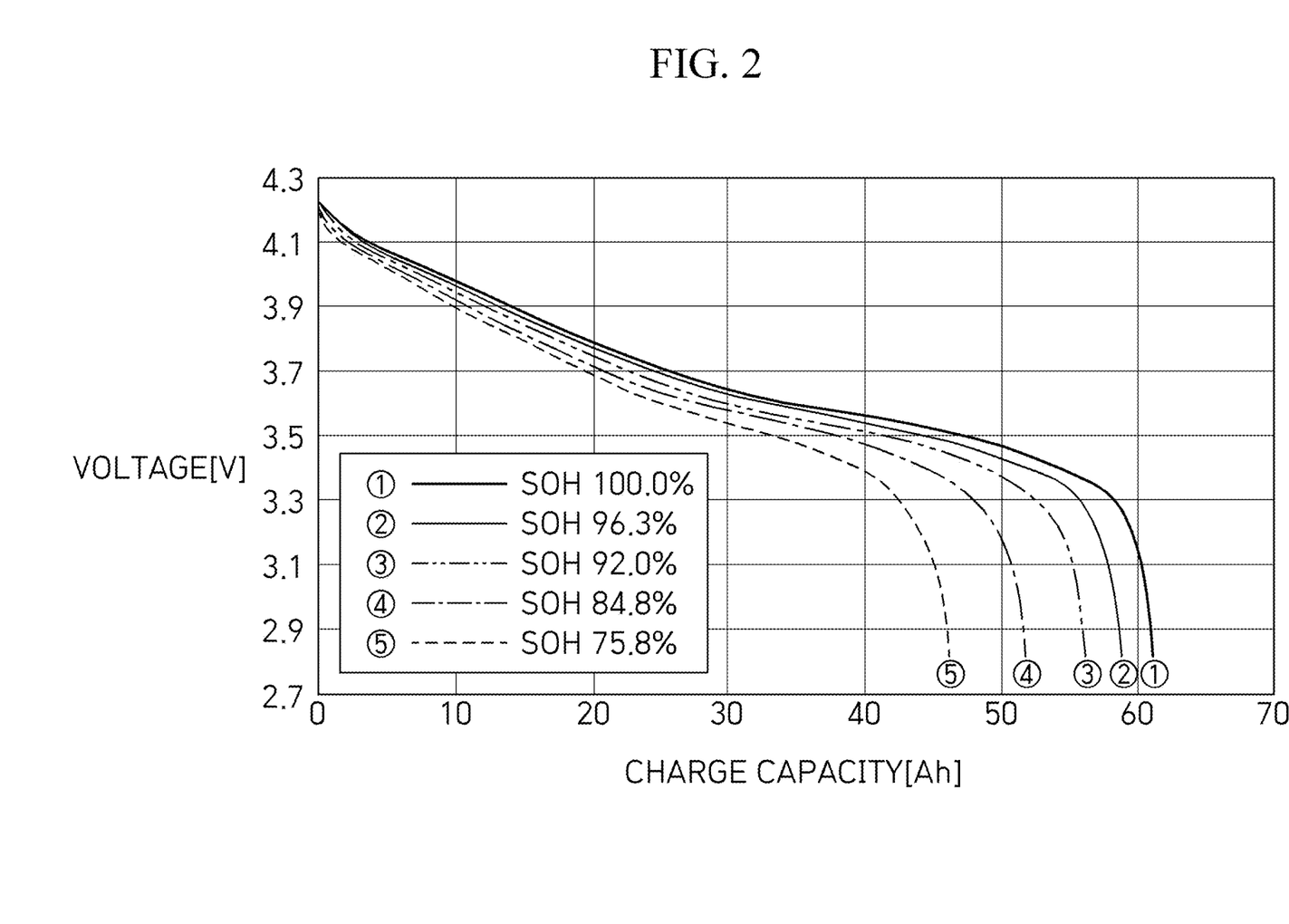
FIG. 2 is a conceptual diagram illustrating capacity degradation of a battery according to a related art.

In the following exemplary embodiments of the present invention, the degree of degradation and SOH of a battery may indicate the degree of degradation with respect to the initial state of the battery and may be used together according to exemplary embodiments (e.g., the degree of degradation or an SOH of 80% may indicate that the battery has 80% charge capacity or lifespan compared with that upon initial production of the battery. According to SOH-specific relationships between a battery voltage and a charge capacity, as shown in FIG. 2, when an SOH is reduced, a battery charge capacity is reduced at the same battery voltage.

Therefore, when a battery SOH (the degree of battery degradation) is taken into consideration in measuring (including estimation, determination, etc.) a battery SOC, the battery SOC can be measured more accurately. When a battery SOH is taken into consideration even in battery charging and discharging control, battery state diagnosis, etc., the control, diagnosis, etc. can be performed more accurately and efficiently.

To this end, the battery controller 110 of the apparatus 100 for managing a battery according to the exemplary embodiment of the present invention determines (including measurement, estimation, etc.) the degree of battery degradation by controlling the battery state storage 120, the charging method determiner 130, and the battery degradation determiner 140 and controls battery charging and discharging or diagnoses a battery state by selecting and applying an algorithm required for controlling battery charging and discharging according to the determined degree of battery degradation.

Also, the battery controller 110 may uniformly control the voltage between battery cells by preventing battery overcharge and over-discharge. In addition, the battery controller 110 may perform functions, such as battery charge level detection (including calculation, measurement, etc.), battery lifespan estimation, cell balancing, temperature management, selective application of a diagnosis algorithm, selective application of a protection algorithm, and intra-vehicle communication, by itself or in association with a main control unit (MCU) (not shown).

The battery state storage 120 according to the exemplary embodiment of the present invention measures the voltage, current, charge capacity, and temperature of the battery and stores the values as battery state information. In general, the SOH and charge capacity of a battery may be affected by the temperature of the battery. For this reason, the voltage, current, and charge capacity of the battery may be measured according to the battery temperature.

The charging method determiner 130 according to the exemplary embodiment of the present invention compares the full charge state of the battery with the state of the battery when starting charging of the battery and determines whether the battery state corresponds to a constant current (CC) charging section or a constant voltage (CV) charging section based on the result of the comparison. Subsequently, the charging method determiner 130 selects (including determination) one of CC charging employing a constant current and CV charging employing a constant voltage on the basis of the determined charging section.

Figure 4:
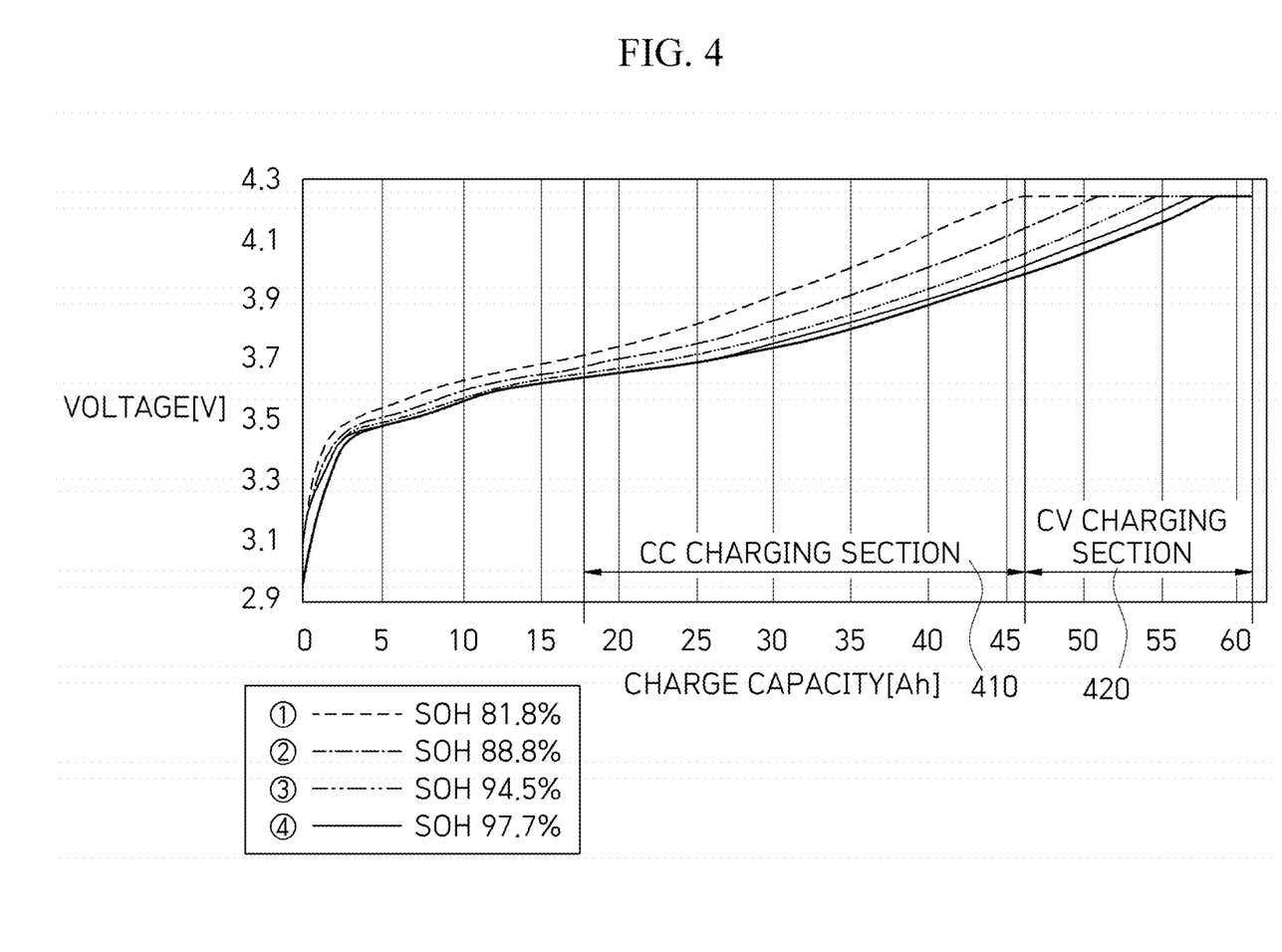
FIG. 4 is a conceptual diagram illustrating the degree of battery degradation in constant current (CC)-constant voltage (CV) charging according to an exemplary embodiment of the present invention.

For example, in charging a battery, a CC charging section 410 or a CV charging section 420 may be selected according to a battery state (the lengths of the CC charging section 410 and the CV charging section 420 may vary according to the battery state and an implementation method) as shown in FIG. 4.

Meanwhile, the full charge state of a battery may be determined by at least one of the effective maximum charge capacity and effective maximum output voltage of the battery, and the charge state of the battery when starting charging of the battery may be determined by at least one of a battery capacity state and output voltage when starting charging of the battery.

The battery degradation determiner 140 according to the exemplary embodiment of the present invention determines the degree of battery degradation using a CC-charging SOH determiner 150 or a CV-charging SOH determiner 160 according to the charging method determined by the charging method determiner 130 and a battery charging method determined on the basis of the battery state information stored in the battery state storage 120.

In other words, when the battery charging method is CC charging, the CC-charging SOH determiner 150 of the battery degradation determiner 140 determines the SOH of the battery by comparing an increase in the charge capacity of the battery with respect to an increase in the charge voltage of the battery with a CC-section SOH mapping table.

The CC-section SOH mapping table is a set of information on battery capacities at specific voltages according to SOHs of the battery. A CC-section SOH mapping table according to the exemplary embodiment of the present invention is as shown in Table 1. Table 1 is a set of information on battery capacities at charge voltages of 3.8 V to 4.25 V according to a plurality of SOH states. The present invention is not limited to Table 1, and the CC-section SOH mapping table may be a set of battery capacity information at a greater number of charge voltages and battery SOHs.

TABLE 1

|        | SOH 100% | SOH 97.7% | SOH 94.5% | SOH 88.8% | SOH 81.8% |
|--------|----------|-----------|-----------|-----------|-----------|
| 3.8 V  | 9.10 Ah  | 8.67 Ah   | 8.55 Ah   | 8.29 Ah   | 7.81 Ah   |
| 3.9 V  | 15.50 Ah | 14.84 Ah  | 14.62 Ah  | 14.16 Ah  | 13.41 Ah  |
| 4.0 V  | 21.42 Ah | 20.62 Ah  | 20.30 Ah  | 19.68 Ah  | 18.63 Ah  |
| 4.1 V  | 26.60 Ah | 25.68 Ah  | 25.29 Ah  | 24.55 Ah  | 23.30 Ah  |
| 4.2 V  | 31.27 Ah | 30.10 Ah  | 29.98 Ah  | 29.16 Ah  | 27.78 Ah  |
| 4.25 V | 33.21 Ah | 32.46 Ah  | 32.07 Ah  | 31.26 Ah  | 29.91 Ah  |

Also, a CC-section SOH mapping table according to the exemplary embodiment of the present invention is not necessarily limited to specific values and may show certain value ranges. In other words, the CC-section SOH mapping table may show certain ranges, such as a charge voltage of 3.80 V to 3.85 V instead of 3.8 V, a charge capacity of 9.05 Ah to 9.15 Ah instead of 9.10 Ah, and an SOH of 97.5% to 97.9% instead of 97.7% SOH.

Meanwhile, in determining the SOH of the battery through comparison between an increase in the charge capacity of the battery with respect to an increase in the charge voltage of the battery and the CC-section SOH mapping table, the CC-charging SOH determiner 150 according to the exemplary embodiment of the present invention may determine the SOH of the battery by comparing information on a certain number of voltage-specific battery capacities or more with an increase in the battery capacity with respect to an increase in the charge capacity of the battery in the CC-section SOH mapping table.

For example, referring to Table 1, when the charge voltage of the battery increases from 3.8 V to 3.9 V, the battery capacity may increase from 8.67 Ah to 14.84 Ah. In this case, the SOH may not be directly determined to be 97.7%, and an increase in the battery capacity in the next section (the section between 3.9 V and 4.0 V) may also be taken into consideration to determine the battery SOH (the number of sections to be taken into consideration may vary according to the method of use and an environment). Here, information on voltage-specific battery capacities used to determine the battery SOH may vary according to the method of use and the environment.

Figure 5A:
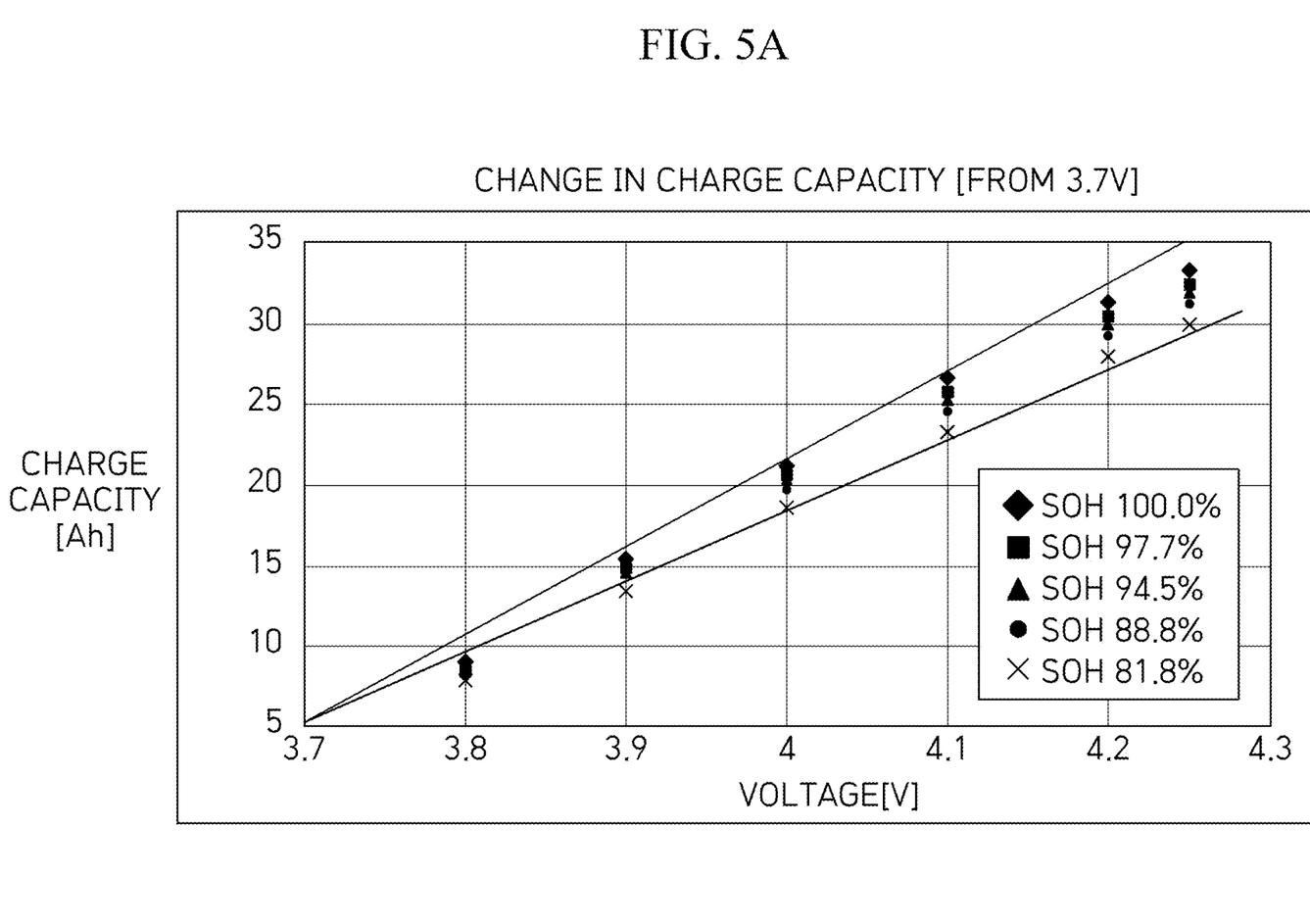
FIG. 5A is a conceptual diagram illustrating a change in charge capacity with respect to the degree of battery degradation in a CC charging section according to an exemplary embodiment of the present invention.
Figure 5B:
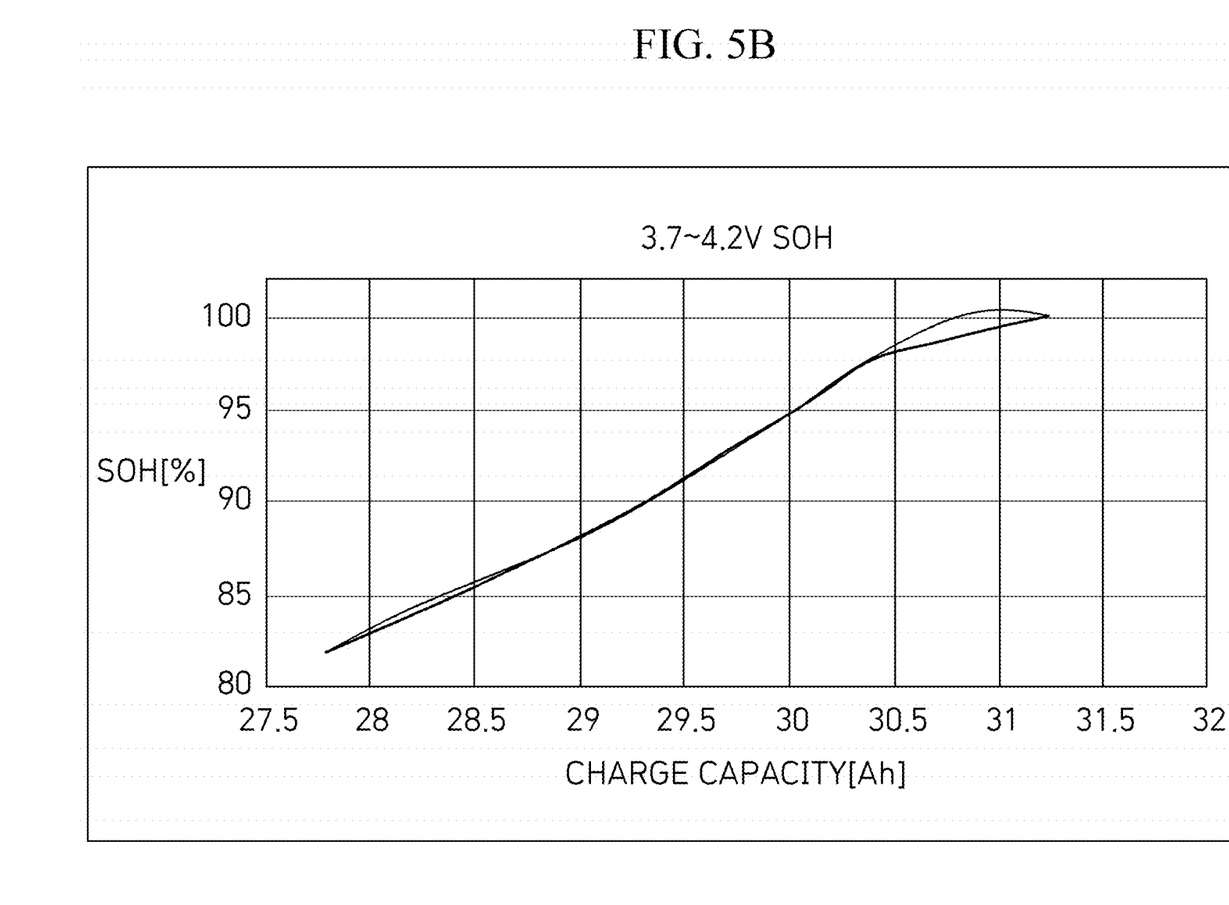
FIG. 5B is a conceptual diagram illustrating a method of determining the degree of battery degradation in a CC charging section according to an exemplary embodiment of the present invention.

A CC-section SOH mapping table according to the exemplary embodiment of the present invention may be represented by a graph as shown in FIG. 5A. Also, in a certain voltage section, an SOH corresponding to a battery charge capacity may be represented by an approximation equation. Equation 1 approximates the relationship between a charge capacity and an SOH at a battery voltage of 3.7 V to 4.2 V when the relationship is as shown in FIG. 5B.

$$y=-0.5205x^4+60.904x^3-2670.9x^2+52030x-379836;$$
$$R^2=1 \quad \text{[Equation 1]}$$

Here, x is a charge capacity, and y is an SOH value. R represents the degree of approximation of Equation 1.

Meanwhile, when the battery charging method is CV charging, the CV-charging SOH determiner 160 of the battery degradation determiner 140 determines the SOH of the battery by comparing at least one of information on an increase in the charge capacity of the battery and information on an increase in the charge time of the battery in a CV-section SOH mapping table with at least one of an increase in the charge capacity of the battery under CV charging and an increase in the charge time of the battery under CV charging.

Figure 6:
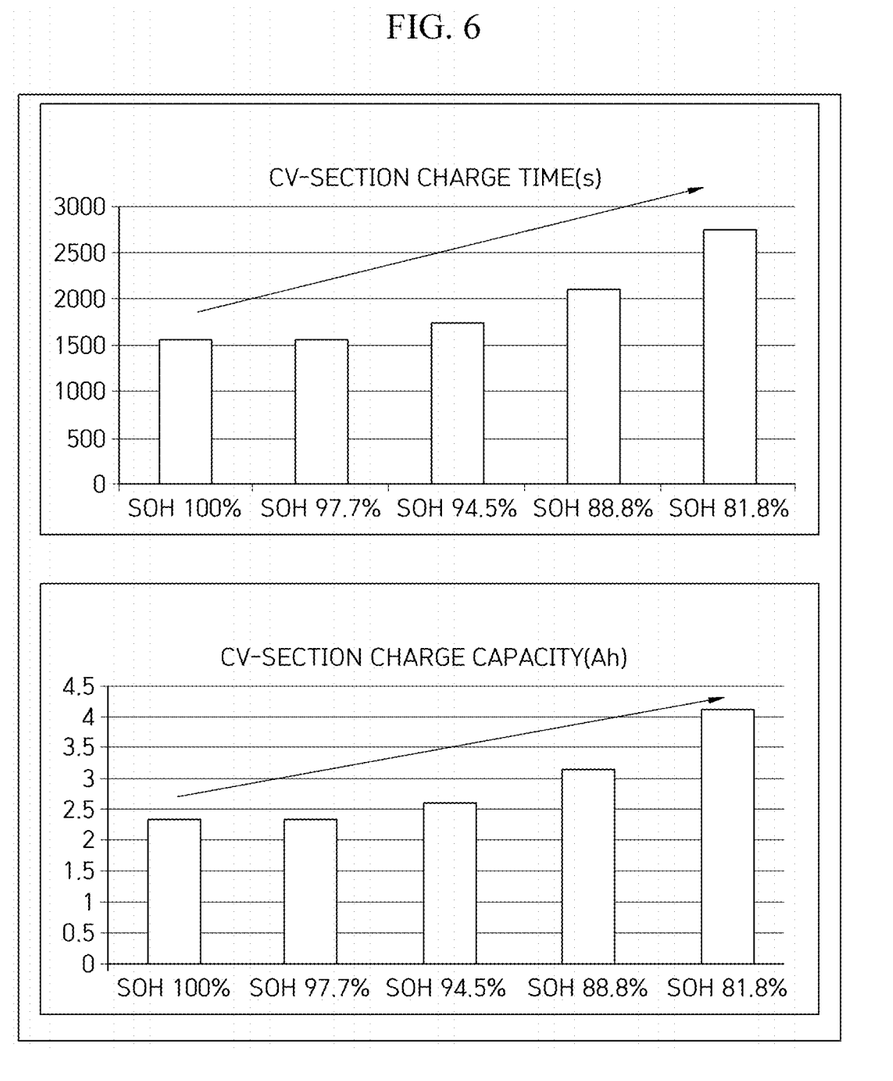
FIG. 6 is a conceptual diagram illustrating a method of determining the degree of battery degradation in a CV charging section according to an exemplary embodiment of the present invention.

The CV-section SOH mapping table according to the exemplary embodiment of the present invention is a set of CV-section battery capacity information and CV-section charge time information according to SOHs of the battery. For example, a CV-section SOH mapping table may be generated by collecting information on CV-section charge times (a time taken to finish charging) according to battery SOHs and increases in CV-section charge capacities as shown in FIG. 6.

In other words, the SOH of the battery may be determined using at least one of information on a time taken for a CV section to end on the basis of an SOH of 100% and information on an increase in the charge capacity on the basis of the SOH of 100%.

Figure 7:
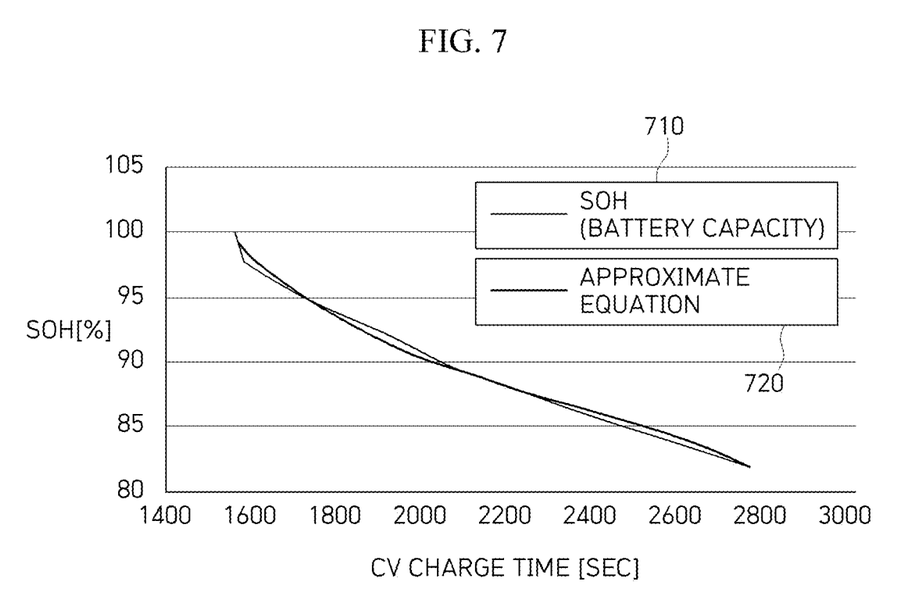
FIG. 7 is a conceptual diagram illustrating a relationship between a charge time and the degree of battery degradation in a CV charging section according to an exemplary embodiment of the present invention.

Like Equation 1, in a certain voltage section, an SOH corresponding to a battery charge capacity may be represented by an approximation equation. As shown in FIG. 7, Equation 2 shows an approximation 720 of a relationship 710 between a CV charge time and an SOH.

$$y=-1E\text{-}0.8x^3+8E\text{-}0.5x^2-0.2059x+260.83; \; R^2=0.9935 \quad \text{[Equation 2]}$$

Here, x is a charge time, and y is an SOH value. R represents the degree of approximation of Equation 2.

Meanwhile, the CV-section SOH mapping table may be a set of certain value ranges instead of a set of specific values like the CC-section SOH mapping table. Next, a method of measuring the degree of battery degradation according to an exemplary embodiment of the present invention will be described below.

Figure 8:
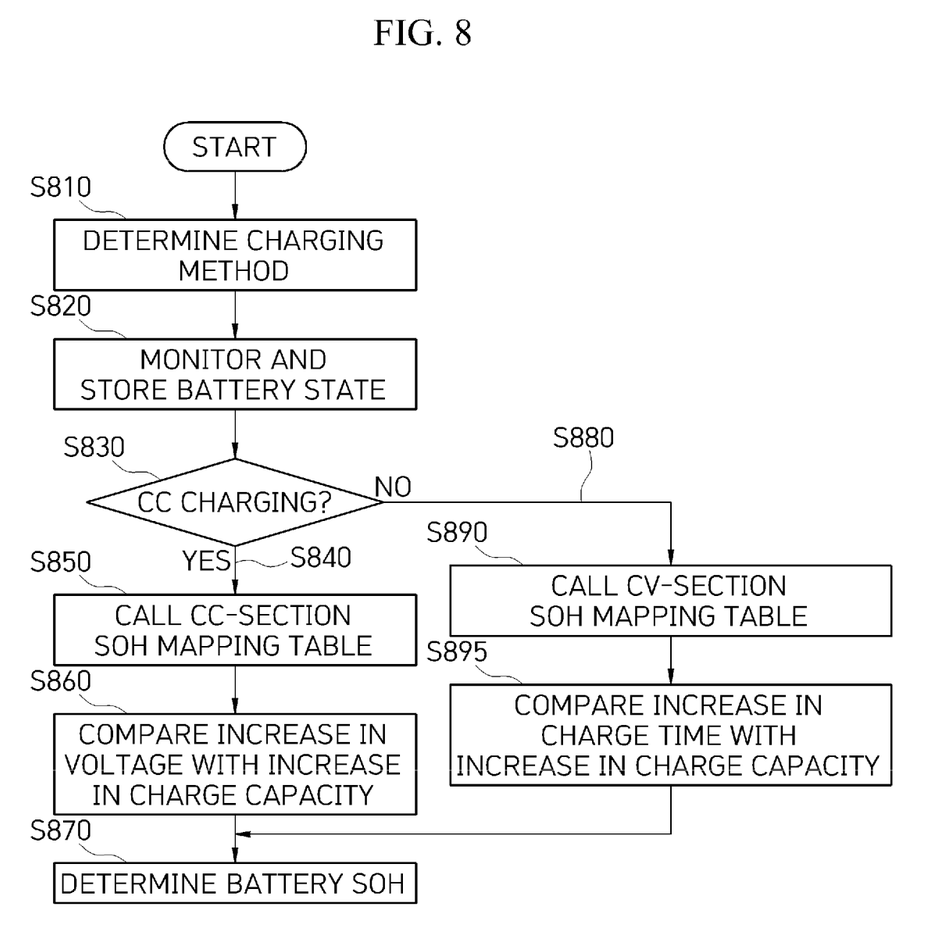
FIG. 8 is a flowchart illustrating a method of determining the degree of battery degradation according to an exemplary embodiment of the present invention.

FIG. 8 is a flowchart illustrating a method of determining the degree of battery degradation according to an exemplary embodiment of the present invention.

The method of determining the degree of battery degradation according to the exemplary embodiment of the present invention illustrated in FIG. 8 is an exemplary embodiment of a method of determining the degree of battery degradation by using the apparatus 100 for managing a battery according to the exemplary embodiment of the present invention illustrated in FIG. 1.

First, a charging method is determined for a battery to be charged (S810). To this end, the full charge state of the battery is compared with the state of the battery at the start of charging, and it is determined which one of a CC charging section and a CV charging section corresponds to the battery state at the start of charging on the basis of the comparison result.

Subsequently, an appropriate one of CC charging and CV charging is selected (determined) on the basis of the determined charging section. Then, information on the battery state is stored (S820). The stored battery state information includes the voltage, current, charge capacity, and temperature of the battery.

Subsequently, it is determined which charging method is the determined charging method (S830). When the determined charging method is CC charging (S840), a CC-section SOH mapping table is called (S850), and information on increases in the voltage and charge capacity of the battery under charge is compared with information on voltage-specific charge capacities in the called CC-section SOH mapping table (S860).

In this case, as described above, a CC-section SOH mapping table which shows value ranges may be used for the comparison according to an implementation method, and a certain number of pieces of voltage-specific charge capacity information or more may be compared. The SOH of the battery is determined (decided) through such a comparison (S870).

Meanwhile, when the determined charging method is CV charging (S880), a CV-section SOH mapping table is called (S890), and at least one of increases in the charge time and charge capacity of the battery under CV charging is compared with corresponding information on SOH-specific charge capacity increases and charge time increases in the called CV-section SOH mapping table (S895).

In this case, as described above, a CV-section SOH mapping table which shows value ranges may be used for the comparison according to an implementation method. The SOH of the battery is determined (decided) through such a comparison (S870). Next, a method of managing a battery considering the degree of battery degradation according to an exemplary embodiment of the present invention will be described below.

Figure 9:
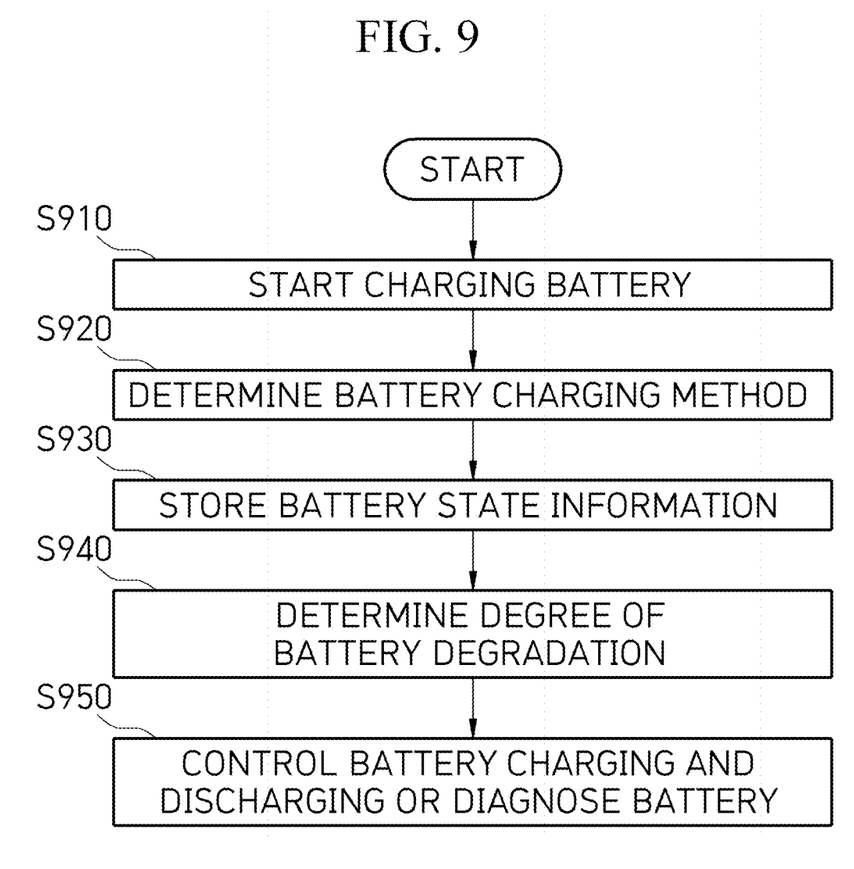
FIG. 9 is a flowchart illustrating a method of managing a battery considering the degree of battery degradation according to an exemplary embodiment of the present invention.

FIG. 9 is a flowchart illustrating a method of managing a battery considering the degree of battery degradation according to an exemplary embodiment of the present invention.

The method of managing a battery considering the degree of battery degradation according to the exemplary embodiment of the present invention illustrated in FIG. 9 is a method of controlling battery charging and discharging and diagnosing a battery on the basis of the apparatus 100 for managing a battery according to the exemplary embodiment of the present invention illustrated in FIG. 1 and the method of determining the degree of battery degradation according to the exemplary embodiment of the present invention illustrated in FIG. 8.

First, battery charging is started (S910), and one battery charging method is determined between CC charging and CV charging (S920). A battery charging method is determined in the way described above.

Subsequently, information on a battery state, which has been generally described above, is stored (S930). The above-described battery SOH determination in CC charging or CV charging is performed on the basis of the determined battery charging method and the battery state information (S940).

Then, an appropriate battery charging and discharging algorithm for the determined battery SOH is selected on the basis of information on the determined battery SOH, and charging and discharging of the battery is controlled (S950). Otherwise, an appropriate battery diagnosis algorithm for the battery SOH is selected on the basis of information on the battery SOH which is determined as described above, and the battery is diagnosed using the battery diagnosis algorithm (S950).

Since diagnosis algorithm selection and application and/or charging and discharging control optimized for the degree of battery degradation is performed by considering the degree of battery degradation as described above, it is possible to accurately estimate a battery SOC and reset an available SOC according to battery degradation so that a battery lifespan may be increased. Also, since accuracy in malfunction diagnosis according to a battery charge amount is improved, it is possible to reduce the number of items to be diagnosed in battery diagnosis.

According to the present invention, it is possible to improve accuracy in measurement by applying the degree of battery degradation to measurement of the state of a battery. Also, since the battery can be managed and controlled appropriately for the battery state, it is possible to increase the battery lifespan and improve the performance.

Although the above-described elements have been described as separate devices, the description is merely exemplary for convenience of description and better understanding, and the elements may be implemented in various forms within the technical scope of the present invention. For example, the battery state storage 120 and the charging method determiner 130 may be integrated into one module or divided into two or more devices.

Methods according to the exemplary embodiments of the present invention can be implemented in the form of program commands, which can be executed by various computing devices, and recorded in a computer-readable medium. The computer-readable medium may include program commands, data files, data structures, etc. separately or in combination. The program commands recorded in the computer-readable medium may be specially designed or structured for the present invention or well-known and available to those of ordinary skill in the field of computer software.

Examples of the computer-readable medium include hardware devices, such as a read only memory (ROM), a random access memory (RAM), and a flash memory, specially designed to store and execute program commands. Examples of the program commands include not only a machine language code generated by a compiler but also a high level language code executable by a computer using an interpreter. The above-described hardware devices may be configured to operate as at least one software module to perform operation of the present invention, and vice versa.

The embodiments according to the present invention recorded in a computer recoding medium may be applied to a computer system. The computer system may include at least one processor, a memory, a user input device, a user output device, and a storage unit. The above described components perform communication through a bus. In addition, the computer system may further include a network interface coupled to a network. The processor may be a central processing unit (CPU) or a semiconductor device for processing instructions stored in the memory and/or storage unit. The memory and the storage unit may include various forms of volatile or nonvolatile media. For example, the memory may include a read only memory (ROM) or a random-access memory (RAM). Accordingly, the embodiments of the present invention may be embodied as a method implemented by a computer or a non-transitory computer readable media including program executable instructions stored in the computer. When executed by a processor, computer readable commands may perform a method according to at least one aspect of the present invention.

The present invention has been described in detail above with reference to the exemplary embodiments. However, the above-described embodiments are merely examples, and the scope of the present invention is not limited thereto. Those of ordinary skill in the technical field to which the present invention pertains should be able to make various modifications and alterations from the above description within the technical spirit of the present invention. Therefore, the scope of the present invention should be defined by the following claims.

What is claimed is:

1. A method of measuring a degree of battery degradation, the method comprising:
    determining a charging method when starting charging of a battery;
    storing a state of the battery when starting charging of the battery; and
    when the determined charging method is constant current (CC) charging, determining a state of health (SOH) of the battery by comparing an increase in charge capacity of the battery with respect to an increase in charge voltage of the battery with a CC-section SOH mapping table, and when the determined charging method is constant voltage (CV) charging, determining the SOH of the battery by comparing at least one of an increase in charge capacity of the battery or a charge time of the battery with a CV-section SOH mapping table,
    wherein the CC-section SOH mapping table is a set of information on battery capacities at specific voltages according to each SOH of the battery.

2. The method of claim 1, wherein the determining of the SOH of the battery by comparing the increase in charge capacity of the battery with respect to the increase in charge voltage of the battery with the CC-section SOH mapping table comprises determining the SOH of the battery by comparing information on at least one voltage-specific battery capacity selected from the CC-section SOH mapping table with the increase in charge capacity of the battery with respect to the increase in charge voltage of the battery.

3. The method of claim 1, wherein the SOH of the battery is determined using different types of SOH mapping tables depending on whether the charging method determined when starting charging of the battery is the CC charging or the CV charging.

4. The method of claim 1, wherein the determining of the charging method when starting charging of the battery comprises:
    comparing a full charge state of the battery with a charge state of the battery when starting charging of the battery;
    determining at least one of a CC charging section or a CV charging section on the basis of the comparing; and
    determining one of CC charging and CV charging on the basis of the determined charging section.

5. The method of claim 4, wherein the full charge state of the battery is determined by at least one of an effective maximum charge capacity and an effective maximum output voltage of the battery, and
    the charge state of the battery when starting charging of the battery is determined by at least one of a battery capacity state or output voltage.

6. The method of claim 1, wherein the CV-section SOH mapping table is a set of CV-section charge capacity information and CV-section charge time information according to each SOH of the battery.

7. The method of claim 6, wherein the determining of the SOH of the battery by comparing the at least one of the increase in charge capacity of the battery or the charge time of the battery with the CV-section SOH mapping table comprises determining the SOH of the battery by comparing at least one of CV-section charge capacity increase information or charge time information selected from the CV-section SOH mapping table with at least one of the increase in charge capacity of the battery or an increase in charge time of the battery.

8. A method of managing a battery considering battery degradation, the method comprising:
    starting charging of a battery;
    measuring a degree of degradation of the battery by using at least one of constant current (CC) charging or constant voltage (CV) charging selected on the basis of a state of the battery; and
    charging the battery by using a battery charging and discharging algorithm selected on the basis of the measured degree of degradation of the battery,
    wherein the measuring of the degree of degradation of the battery comprises:
        when CC charging is selected, determining a state of health (SOH) of the battery by comparing an increase in charge capacity of the battery with respect to an increase in charge voltage of the battery with a CC-section SOH mapping table,
        when CV charging is selected, determining the SOH of the battery by comparing at least one of an increase in charge capacity of the battery or a charge time of the battery with a CV-section SOH mapping table, and
    wherein the CC-section SOH mapping table is a set of information on battery capacities at specific voltages according to each SOH of the battery.

9. The method of claim 8, further comprising diagnosing the state of the battery by using a battery diagnosis algorithm selected on the basis of the measured degree of degradation of the battery.

10. The method of claim 8, wherein the determining of the SOH of the battery by comparing the increase in charge capacity of the battery with respect to the increase in charge voltage of the battery with the CC-section SOH mapping table comprises determining the SOH of the battery by comparing information on at least one voltage-specific battery capacity selected from the CC-section SOH mapping table with the increase in charge capacity of the battery with respect to the increase in charge voltage of the battery.

11. The method of claim 8, wherein the SOH of the battery is determined using different types of SOH mapping tables depending on whether a charging method determined when starting charging of the battery is the CC charging or the CV charging.

12. The method of claim 8, wherein the CV-section SOH mapping table is a set of CV-section charge capacity information and CV-section charge time information according to each SOH of the battery.

13. The apparatus of claim 12, wherein the determining of the SOH of the battery by comparing at least one of the increase in charge capacity of the battery or the charge time of the battery with the CV-section SOH mapping table comprises determining the SOH of the battery by comparing at least one of CV-section charge capacity increase information or charge time information selected from the CV-section SOH mapping table with at least one of the increase in charge capacity of the battery or an increase in charge time of the battery.

14. An apparatus for managing a battery considering battery degradation, the apparatus comprising:
    a battery controller;
    a battery state storage;
    a charging method determiner configured to determine a charging method of the battery; and a battery degradation determiner configured to determine a degree of battery degradation, wherein the battery degradation determiner is further configured to:

when the determined charging method is constant current (CC) charging, determine a state of health (SOH) of the battery by comparing an increase in charge capacity of the battery with respect to an increase in charge voltage of the battery with a CC-section SOH mapping table, when the determined charging method is constant voltage (CV) charging, determining the SOH of the battery by comparing at least one of an increase in charge capacity of the battery or a charge time of the battery with a CV-section SOH mapping table, and wherein the CC-section SOH mapping table is a set of information on battery capacities at specific voltages according to each SOH of the battery.

15. The apparatus of claim 14, wherein the charging method determiner determines at least one of constant current (CC) charging or constant voltage (CV) charging on the basis of a result of comparing a full charge state of a battery with a state of the battery when starting charging of the battery.

16. The apparatus of claim 14, wherein the battery degradation determiner comprises at least one of a constant current (CC)-section state of health (SOH) determiner or a constant voltage (CV)-section SOH determiner.

17. The apparatus of claim 14, wherein the battery controller performs at least one of battery charging and discharging control or battery diagnosis by considering battery degradation.

18. The apparatus of claim 14, wherein the SOH of the battery is determined using different types of SOH mapping tables depending on whether the charging method determined when starting charging of the battery is the CC charging or the CV charging.

* * * * *

UNITED STATES PATENT AND TRADEMARK OFFICE
CERTIFICATE OF CORRECTION

PATENT NO. : 11,527,900 B2  
APPLICATION NO. : 16/850813  
DATED : December 13, 2022  
INVENTOR(S) : Dong Rak Kim Page 1 of 1

It is certified that error appears in the above-identified patent and that said Letters Patent is hereby corrected as shown below:

On the Title Page

On Column 1, item (73), after "Assignee", please replace as follows:
HYUNDAI MOBIS CO., LTD. Seoul Korea Republic Of Signed and Sealed this
First Day of August, 2023

Katherine Kelly Vidal
*Director of the United States Patent and Trademark Office*